(12) United States Patent
Garni et al.

(10) Patent No.: US 7,881,138 B2
(45) Date of Patent: Feb. 1, 2011

(54) MEMORY CIRCUIT WITH SENSE AMPLIFIER

(75) Inventors: Brad Garni, Austin, TX (US); Thomas Andre, Austin, TX (US); Jean Lasseuguette, Grenoble (FR)

(73) Assignee: Freescale Semiconductor, Inc., Austin, TX (US)

( * ) Notice: Subject to any disclaimer, the term of this patent is extended or adjusted under 35 U.S.C. 154(b) by 76 days.

(21) Appl. No.: 12/373,184

(22) PCT Filed: Jul. 10, 2006

(86) PCT No.: PCT/IB2006/054095

§ 371 (c)(1),
(2), (4) Date: Jan. 9, 2009

(87) PCT Pub. No.: WO2008/007174

PCT Pub. Date: Jan. 17, 2008

(65) Prior Publication Data

US 2009/0290443 A1 Nov. 26, 2009

(51) Int. Cl.
*G11C 7/06* (2006.01)

(52) U.S. Cl. .......................... 365/207; 365/208; 365/209

(58) Field of Classification Search .................. 365/207, 365/208, 209
See application file for complete search history.

(56) References Cited

U.S. PATENT DOCUMENTS

| | | | |
|---|---|---|---|
| 4,504,748 A | | 3/1985 | Oritani |
| 5,293,345 A | * | 3/1994 | Iwahashi ................ 365/185.21 |
| 6,115,285 A | * | 9/2000 | Montanari et al. ...... 365/185.03 |
| 6,191,989 B1 | | 2/2001 | Luk et al. |
| 6,256,247 B1 | | 7/2001 | Perner |
| 6,600,690 B1 | | 7/2003 | Nahas et al. |
| 6,621,729 B1 | * | 9/2003 | Garni et al. .................. 365/158 |
| 6,762,953 B2 | * | 7/2004 | Tanizaki et al. .............. 365/158 |
| 7,038,959 B2 | * | 5/2006 | Garni .......................... 365/203 |
| 2003/0107916 A1 | * | 6/2003 | Ooishi ......................... 365/171 |

* cited by examiner

*Primary Examiner*—Hoai V Ho
*Assistant Examiner*—Jay Radke
(74) *Attorney, Agent, or Firm*—James L. Clingan, Jr.

(57) ABSTRACT

A memory has a pre-amplifier for generating an output signal and a reference signal. The memory includes a comparator for comparing the output signal to the reference signal. The comparator includes a bias stage for generating a bias signal, wherein the bias signal is an average of the output signal and the reference signal. The comparator further includes a first output stage for generating a first comparator output signal by comparing the output signal and the bias signal. The comparator further includes a second output stage for generating a second comparator output signal by comparing the reference signal and the bias signal.

18 Claims, 1 Drawing Sheet

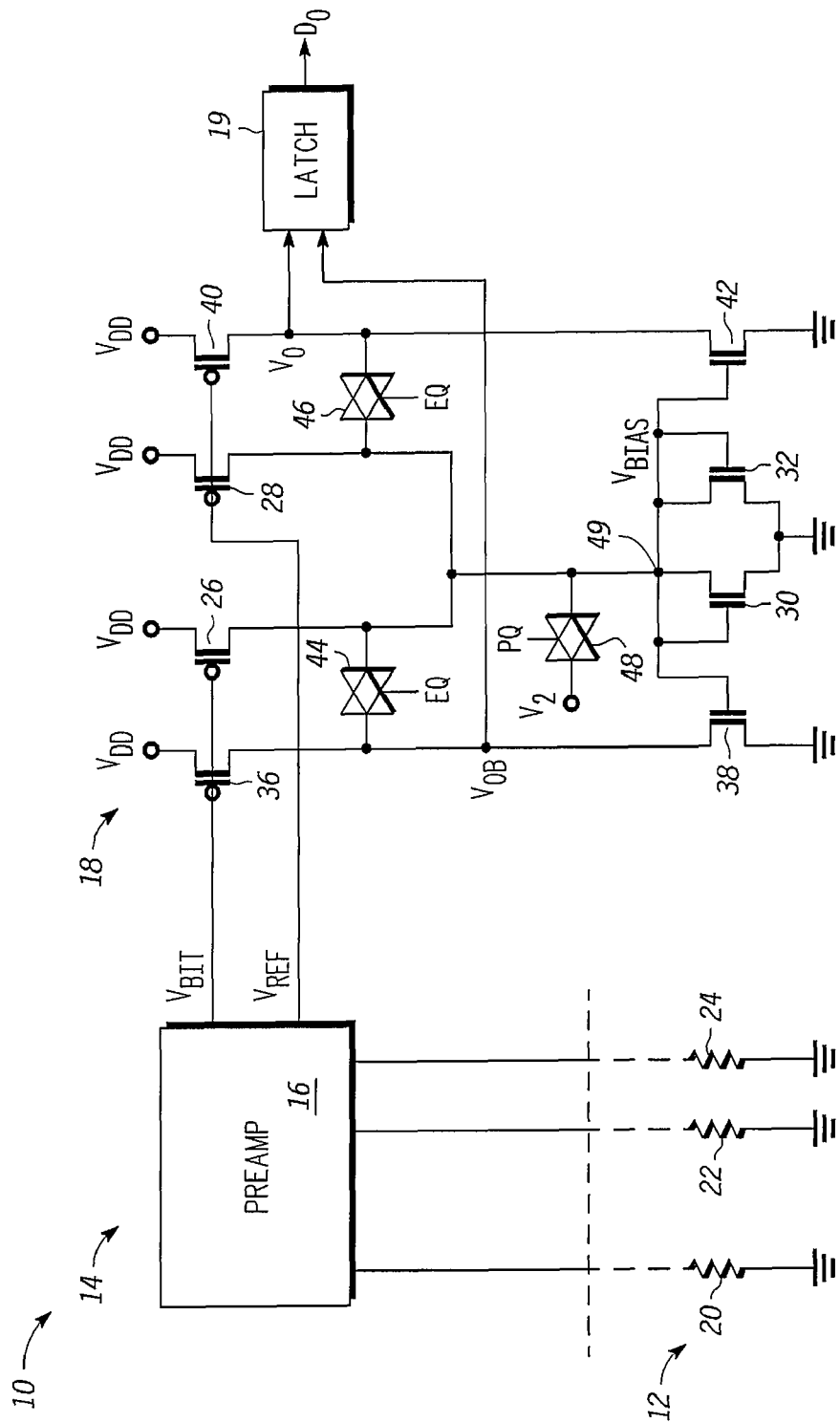
FIGURE

MEMORY CIRCUIT WITH SENSE AMPLIFIER

FIELD OF THE INVENTION

This invention relates to memory circuits, and more particularly, to sensing the logic state of memory cells in a memory circuit.

BACKGROUND OF THE INVENTION

In memories, a continuing desire is increased speed, which primarily is limited by the read operation in which sensing of the logic state of memory cells is performed. Typical issues are amplification and timing. It is important to only begin sensing when the signal being sensed is sufficiently developed. But due to difficulties in manufacturing in providing perfectly matched transistors, amplification of the signal can begin in the wrong direction early in the signal development stage. Any waiting for signal development adds to the read time, which is undesirable. This tension between waiting to ensure sufficient signal development and early sensing for fast read times is generally present in the design of a memory. Thus, any improvements in the ability to begin the sensing as early as possible while avoiding beginning sensing when the signal being sensed is not sufficiently developed is desirable.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawing:

The sole FIGURE is a combination circuit diagram and block diagram of a memory according to an embodiment of the invention.

DETAILED DESCRIPTION OF THE INVENTION

In one aspect, a memory has a sense amplifier that has a comparator for comparing a reference voltage and bit signal, which is the signal being sent and further has a bias circuit. The bias circuit generates a bias voltage that is based on a combination of the bit signal and a reference voltage. By using the combination for the bias voltage, the comparator is able to avoid amplifying in the wrong direction at the beginning of sensing. This is better understood by reference to the drawings and the following description.

Shown in the FIGURE is a memory circuit 10 comprising a memory array 12 and a sense amplifier 14. Sense amplifier 14 comprises a preamplifier 16 coupled to memory array 12, a comparator 18 coupled to preamplifier 16, and a latch 19 coupled to comparator 18. In the FIGURE only memory cells 20, 22, and 24 are shown for memory array 12 but many more cells are present but not shown. Memory cell 20 depicts a memory cell that has been selected for sensing. Memory cells 22 and 24 are reference cells; one being a logic high and the other a logic low. Array 12 in this example is a magnetoresistive random access memory (MRAM) but could be another memory type such as, for example, a floating gate memory, a read only memory, or a dynamic random access memory. Many features of a memory that are well known in the art, such as decoders, address buffers, and write circuitry, are not shown in the FIGURE.

Preamplifier 16 provides a first stage of amplifying. Preamplifier 16 provides a bit signal Vbit based on memory cell 20, and a reference voltage Vref based on the combination of memory cells 22 and 24. In typical fashion, bit signal Vbit and reference voltage Vref become active in response to a clock signal.

Comparator 18 comprises P channel transistors 26, 28, 36, and 40; N channel transistors 30, 32, 38, and 42; and transmission gates 44, 46, and 48. Transistor 26 has a gate for receiving bit signal Vbit, a source connected to a positive power supply terminal VDD, and a drain. Transistor 28 has gate for receiving reference voltage Vref, a source connected to VDD, and drain connected to the drain of transistor 26. Transistor 30 has a gate and drain connected to the drains of transistors 26 and 28 and a source connected to a negative power supply terminal, ground in this example. Transistor 32 has a gate and drain connected to the drains of transistors 26 and 28 and a source connected to ground. Transistors 26 and 28, 30, and 32 form a bias circuit in which a bias signal Vbias is provided at a bias node 49 at the connections of the drains of transistors 26, 28, 30, and 32.

Transistor 36 has a gate for receiving bit signal Vbit, a source connected to a positive power supply terminal VDD, and a drain. Transistor 38 has a gate connected to the drain of transistor 30, drain connected to the drain of transistor 36, and a source connected to ground. Transistor 40 has a gate for receiving a voltage reference Vref, a source connected to VDD, and a drain. Transistor 42 has a drain connected to the drain of transistor 40, a gate connected to the drain of transistor 30, and a source connected to ground. Transistors 36 and 38 form one output stage, and transistors 40, and 42 form another output stage of comparator 18 in which the true output is at the drains of transistors 40 and 42 and is shown as output Vo. The complementary output is at the drains of transistors 36 and 38 and is shown as output bar Vob.

Latch 19 has a first input for receiving output Vo, a second input for receiving output bar Vob, and an output for providing a data output signal Do.

In operation a memory cell is selected for reading. In this example, memory cell 20 is selected. Preamplifier 16 provides a current through memory cell 20 and converts that to a voltage which is provided as bit signal Vbit. Similarly, preamplifier 16 provides current through memory cells 22 and 24, takes an average of that current, and converts that to a voltage which is provided as reference voltage Vref. This is a common operation for a first stage in sensing the logic state of MRAM cells.

Transistor 26 receives a bit signal Vbit and provides a corresponding current to transistors 30 and 32 which are diode connected. Similarly transistor 28 receives reference voltage Vref and provides a corresponding current to transistors 30 and 32. With transistors 30 and 32 diode connected, the current through transistors 30 and 32 is mirrored to transistors 38 and 42 by bias signal Vbias to establish a bias current for transistors 38 and 42. This current through transistors 30 and 32, represented by bias signal Vbias, is the sum of currents through transistors 26 and 28. Transistors 30 and 32 are preferably chosen to be the same size so that the current through one of them is equal to the average of the currents through transistors 26 and 28. Thus it is the average current of transistors 26 and 28 that is mirrored by transistors 30 and 32.

The bias current that is established for transistor 38 is the ratio of the size of transistor 38 to the size of one of transistors 30 and 32 times the average current of transistors 26 and 28. The bias current that is established for transistor 42 is the ratio of the size of transistor 42 to the size of one of transistors 30 and 32 times the average current of transistors 26 and 28. Establishing a bias current for transistors 38 and 42 is not necessarily a current that is actually flowing but is the current that would flow if the transistors were in saturation. One of transistors 38 and 42 will not be in saturation when sensing has occurred. Transistors 26 and 28 are preferably the same size. Transistors 38 and 42 are preferably the same size. Transistors 36 and 40 are preferably the same size. The ratio of the transistors 26 to transistor 30 is preferably the same as the ratio of transistor 36 to transistor 38. The effect is that preferably the P to N channel ratio of the bias circuit is the same as the P to N channel ratio of the output stages. This ratio is preferable to provide a bias point at approximately half of the power supply voltage.

Transistor 38 may have a size that is a multiple of the size of transistor 30, so also transistor 36 would have a size that is a multiple of the size of transistor 26. Setting a multiple greater than one in these cases of the size ratio between the output circuit, transistors 36 and 38, and the bias circuit, transistors 26 and 30, has the effect of reducing loading of the bias circuit on the input signal, Vbit. The result is a stronger Vbit so that the output circuit provides a stronger output.

Transistor 36 receives bit signal Vbit while transistor 40 receives reference voltage Vref. For the case where bit signal Vbit is representative of a logic low of memory cell 20, bit signal Vbit will be a lower voltage than reference voltage Vref. Bias voltage Vbias will establish a bias current in transistors 38 and 42 based on the average of the current representative of a logic low and the reference. Transistor 36 will supply more current than the bias current in transistor 38 so that output Vob will rise. Transistor 40 will supply less current than the bias current so that output signal Vo will fall. Output voltages Vo and Vob will thus produce true and complementary signals that latch 19 can readily sense and latch and provide data output signal Do as a logic low. For the case where bit signal Vbit is representative of a logic high of memory cell 20, bit signal Vbit will be a higher voltage than reference voltage Vref. Bias voltage Vbias will establish a bias current in transistors 38 and 42 based on the average of the current representative of a logic high and the reference. Transistor 36 will supply less current than the bias current in transistor 38 so that output Vob will fall. Transistor 40 will supply more current than the bias current so that output signal Vo will rise. Output voltages Vo and Vob will thus produce true and complementary signals that latch 19 can readily sense and latch and provide data output signal Do as a logic high.

Prior to performing the read operation, transmission gates 44 and 46 equalize the drains of the transistors of the comparator and output stage at a voltage V2 supplied by transmission gate 48. Transmission gate 48 is conductive in response to precharge signal PQ which is active prior to a read while transmission gates 44 and 46 are conductive in response to equalization signal EQ being active. Voltage V2 is approximately the level of reference voltage Vref. Precharge signal PQ is made inactive and memory cell 20 is accessed. After sufficient time for bit signal Vbit to become active, signal EQ becomes inactive to allow bias sense amplifier 18 to sense the logic state of bit signal Vbit.

A benefit of this approach of the bias being an average of the reference and the input signal is that the adverse effect of a common mode offset in the reference and input signal is greatly diminished. Also because of the averaging of the bias current, there is minimal adverse impact of mismatched transistors in the bias circuit.

Various other changes and modifications to the embodiments herein chosen for purposes of illustration will readily occur to those skilled in the art. For example, the operation was described for a single memory cell but other memory cells could also be sensed by similar sense amplifiers at the same time. Transistors 30 and 32 were shown for dividing current to provide an average but this could be achieved with just one transistor that is twice as big. Size of a transistor refers to the channel width to channel length ratio. Although there are believed to be benefits in having the P channel to N channel ratios being as described, there may be other possibilities for these ratios that may be beneficial. To the extent that such modifications and variations do not depart from the spirit of the invention, they are intended to be included within the scope thereof which is assessed only by a fair interpretation of the following claims.

What is claimed is:

1. In a memory having a pre-amplifier for generating at least one output signal and at least one reference signal, the memory further comprising at least one comparator for comparing one of the at least one output signal to one of the at least one reference signal, the at least one comparator comprising:
    a bias stage comprising:
        a first transistor of a first conductivity type having a first current terminal coupled to a first supply, a control terminal coupled to the one of the at least one output signal, and a second current terminal;
        a second transistor of the first conductivity type having a first current terminal coupled to the first supply, a control terminal coupled to the one of the at least one reference signal, and a second current terminal directly connected to the second current terminal of the first transistor forming a biasing node; and
        a third transistor of a second conductivity type having a first current terminal directly connected to the biasing node, a control terminal coupled to the biasing node, and a second current terminal coupled to a second supply, wherein the first supply is different from the second supply; and
    a first output stage directly connected to the biasing node and a second output stage directly connected to the biasing node.

2. The memory of claim 1, the first output stage comprising:
    a fourth transistor of the first conductivity type having a first current terminal coupled to the first supply, a control terminal coupled to the one of the at least one output signal, a second current terminal; and
    a fifth transistor of the second conductivity type having a first current terminal coupled to the second current terminal of the fourth transistor, a control terminal coupled to the biasing node, and a second current terminal coupled to the second supply.

3. The memory of claim 2, the second output stage comprising:
    a sixth transistor of the first conductivity type having a first current terminal coupled to the first supply, a control terminal coupled to the one of the at least one reference signal, a second current terminal; and
    a seventh transistor of the second conductivity type having a first current terminal coupled to the second current terminal of the sixth transistor, a control terminal coupled to the biasing node, and a second current terminal coupled to the second supply.

4. The memory of claim 3 further characterized by means for equalizing a voltage at the second current terminal of the fourth transistor to a voltage at the second current terminal of the sixth transistor, in response to an equalization signal.

5. The memory of claim 3 further characterized by means for pre-charging a voltage at the biasing node, a voltage at the second current terminal of the fourth transistor to a voltage at the second current terminal of the sixth transistor, in response to a pre-charging signal.

6. The memory of claim 3, further characterized by a latch coupled to the second current terminal of the fourth transistor and the second current terminal of the sixth transistor, the latch generating a data output signal.

7. The memory of claim 3, wherein the bias stage is further characterized by an eighth transistor of the second conductivity type having a first current terminal coupled to the biasing node a control terminal coupled to the biasing node, and a second current terminal coupled to the second supply.

8. The memory of claim 2, further characterized by the fourth transistor and the first transistor having a first gain ratio and the fifth transistor and the third transistor having a second gain ratio, such that the first gain ratio is substantially the same as the second gain ratio.

9. The memory of claim 7 further characterized by the sixth transistor and the second transistor having a third gain ratio and the seventh transistor and the eighth transistor having a fourth gain ratio, such that the third and fourth gain ratios are substantially the same as the first gain ratio.

10. In a circuit having a pre-amplifier for generating an output signal and a reference signal, a method comprising:
   generating a bias signal as an average of the output signal and the reference signal;
   generating a first comparator output signal by comparing the output signal and the bias signal; and
   generating a second comparator output signal by comparing the reference signal and the bias signal.

11. The method of claim 10 further characterized by equalizing the first comparator output signal and the second comparator output signal, in response to an equalization signal.

12. The method of claim 10 further characterized by pre-charging the first comparator output signal, the second comparator output signal, and the bias signal, in response to a pre-charging signal.

13. The memory of claim 4 further characterized by means for pre-charging a voltage at the biasing node, a voltage at the second current terminal of the fourth transistor to a voltage at the second current terminal of the sixth transistor, in response to a pre-charging signal.

14. The memory of claim 4 further characterized by a latch coupled to the second current terminal of the fourth transistor and the second current terminal of the sixth transistor, the latch generating a data output signal.

15. The memory of claim 2 wherein the bias stage is further characterized by an eighth transistor of the second conductivity type having a first current terminal coupled to the biasing node, a control terminal coupled to the biasing node, and a second current terminal coupled to the second supply.

16. The memory of claim 3 further characterized by the fourth transistor and the first transistor having a first gain ratio and the fifth transistor and the third transistor having a second gain ratio, such that the first gain ratio is substantially the same as the second gain ratio.

17. The memory of claim 8 further characterized by the sixth transistor and the second transistor having a third gain ratio and the seventh transistor and the eighth transistor having a fourth gain ratio, such that the third and fourth gain ratios are substantially the same as the first gain ratio.

18. The method of claim 11 further characterized by pre-charging the first comparator output signal, the second comparator output signal, and the bias signal, in response to a pre-charging signal.

* * * * *